United States Patent [19]
Kizuki

[11] Patent Number: 5,948,161
[45] Date of Patent: Sep. 7, 1999

[54] METHOD OF FABRICATING A SEMICONDUCTOR DEVICE AND METHOD OF CLEANING A CRYSTALLINE SEMICONDUCTOR SURFACE

[75] Inventor: Hirotaka Kizuki, Itami, Japan

[73] Assignee: Mitsubishi Denki Kabushiki Kaisha, Tokyo, Japan

[21] Appl. No.: 08/409,730

[22] Filed: Mar. 24, 1995

[30] Foreign Application Priority Data

Mar. 25, 1994 [JP] Japan ..................... 6-055531

[51] Int. Cl.⁶ .................................. C30B 25/18
[52] U.S. Cl. .................. 117/89; 117/94; 117/95
[58] Field of Search ..................... 117/89, 94, 95; 437/108, 126, 228

[56] References Cited

U.S. PATENT DOCUMENTS

| | | | |
|---|---|---|---|
| 5,030,319 | 7/1991 | Nishino et al. | 156/635 |
| 5,089,441 | 2/1992 | Moslehi . | |
| 5,212,113 | 5/1993 | Azoulay et al. | 437/107 |
| 5,288,657 | 2/1994 | Feygenson et al. | 437/90 |
| 5,403,434 | 4/1995 | Moslehi . | |

FOREIGN PATENT DOCUMENTS

| | | |
|---|---|---|
| 488148 | 11/1991 | European Pat. Off. . |
| 648631 | 1/1989 | Japan . |
| 2102520 | 4/1990 | Japan . |
| 334314 | 2/1991 | Japan . |
| 3-175628 | 7/1991 | Japan . |
| 4-199510 | 7/1992 | Japan . |
| 2218567 | 5/1988 | United Kingdom . |
| 2271466 | 9/1992 | United Kingdom . |

OTHER PUBLICATIONS

Konda et al, "Low–Temperature Surface Cleaning Of GaAs By Electron Cyclotron Resonance (ECR) Plasma", Japanese Journal of Applied Physics, vol. 28, No. 1, 1989, pp. L7–L9.

Kondo et al, "Hydrogen ECR Plasma Surface Cleaning Using AlGaAs Substrates", Institute of Physics Conference, No. 129, 1992, pp. 585–590.

Hong et al, "Removal of GaAs Surface Contaminants Using $H_2$ Electron Cyclotron Resonance Plasma Treatment Followed By $Cl_2$ Chemical Etching", Applied Physics Letters, vol. 62, No. 21, 1993, pp. 2658–2660.

Kizuki et al, "Selective Metalorganic Chemical Vapor Deposition Growth Of GaAs On AlGaAs Combined With In Situ HCl Gas Etching", Journal of Crystal Growth, vol. 134, 1993, pp. 35–42.

Kuiper et al., "Room–Temperature HF Vapor–Phase Cleaning For Low–Pressure Chemical Vapor Deposition of Expitaxial Si and SiGe Layers", J. Electrochem. Soc., vol. 139, No. 9, Sep. 1992, pp. 2594–2599.

Hamm et a., "Selective Area Growth of Heterostructure Bipolar Transistors by Metalorganic Molecular Beam Epitaxy", Applied Physics Letter, vol. 61, No. 5, Aug. 3, 1992, pp. 592–594.

*Primary Examiner*—Robert Kunemund
*Attorney, Agent, or Firm*—Leydig, Voit & Mayer, Ltd.

[57] ABSTRACT

In fabricating a semiconductor device, a semiconductor layer containing Al and a cap layer not containing Al are successively grown on a semiconductor substrate and are placed in a halogen gas environment where a chemical reaction between a halogen and an oxide film naturally formed on the cap layer removes the oxide film. Then, without exposing the layer to the atmosphere, the halogen gas environment is replaced with a dry-etching environment and the cap layer is dry-etched to a desired depth. Then, without exposing a semiconductor layer to the atmosphere, the dry-etching environment is replaced with a crystal growth environment. Subsequently, another semiconductor layer is grown on the semiconductor layer. A regrowth interface of excellent cleanliness is realized and the crystallinity of the regrown semiconductor layer is improved.

19 Claims, 12 Drawing Sheets

Fig.1 (a) carbon(C)
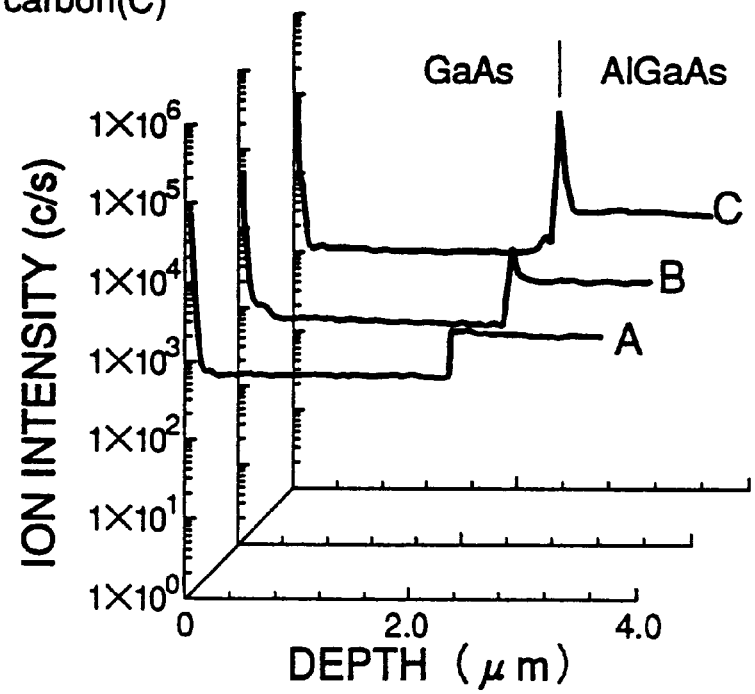
Fig.1 (b) oxygen(O)
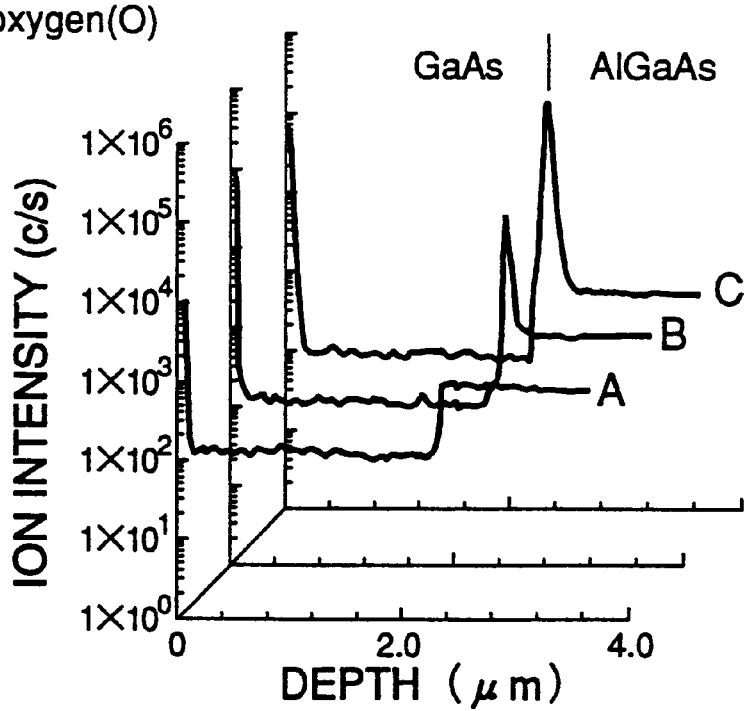

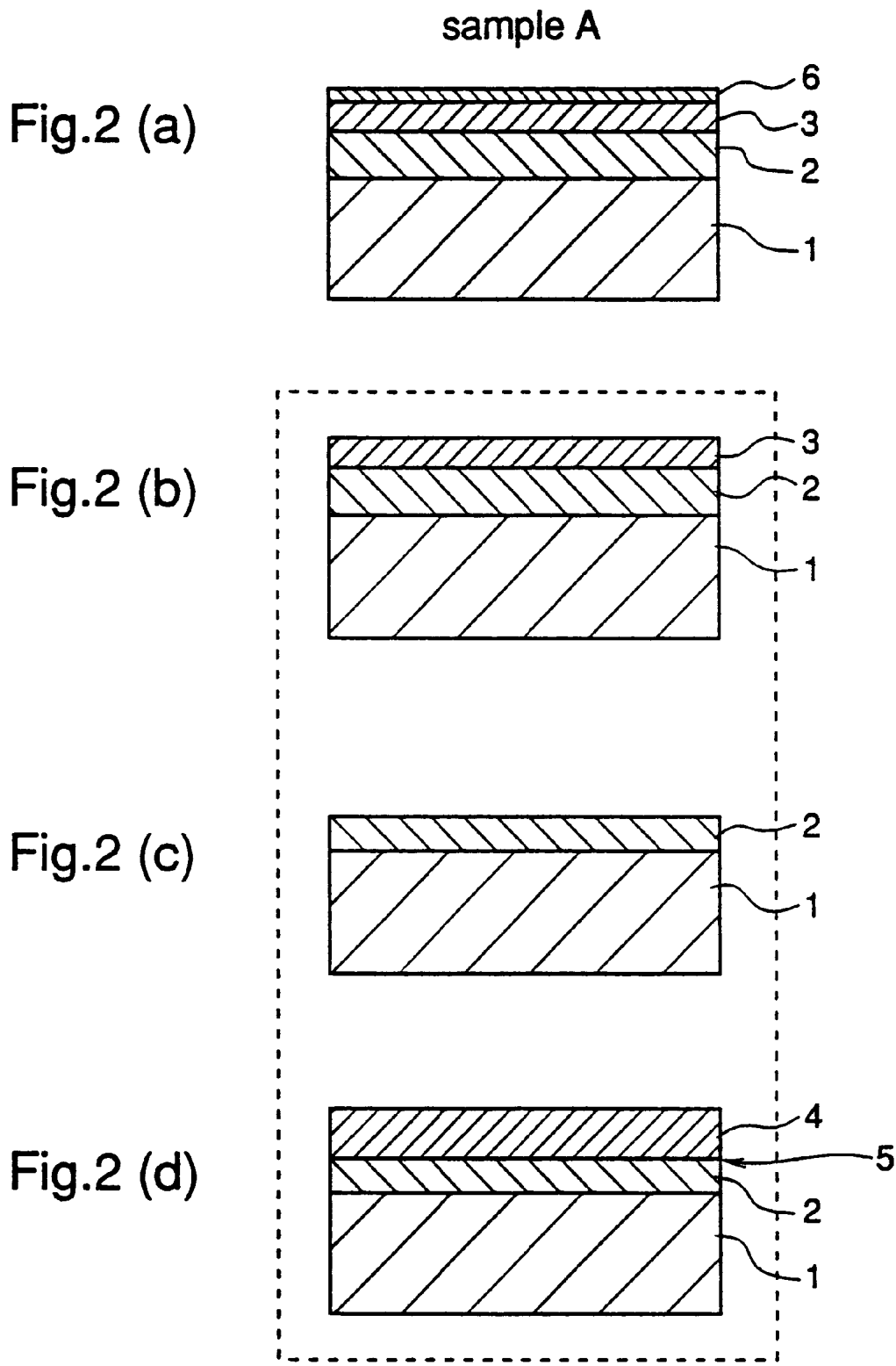

sample B
Fig.9 (a) (PRIOR ART)
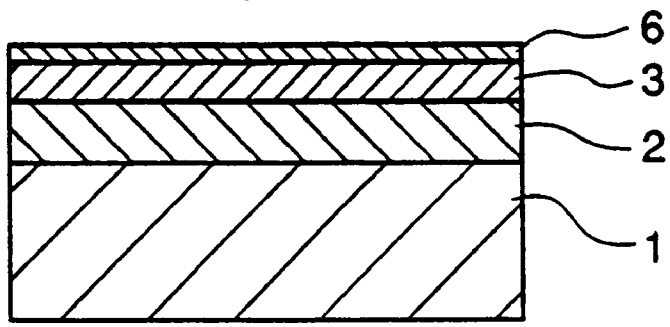
Fig.9 (b) (PRIOR ART)
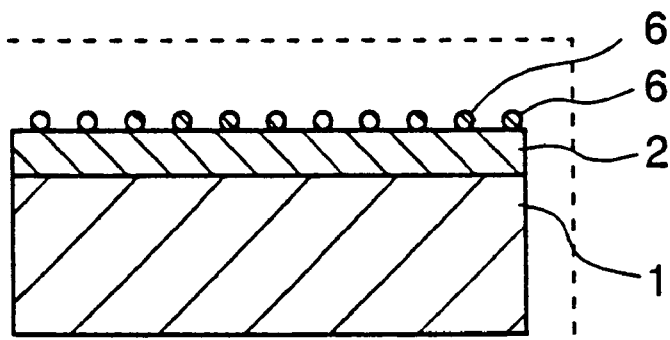
Fig.9 (c) (PRIOR ART)
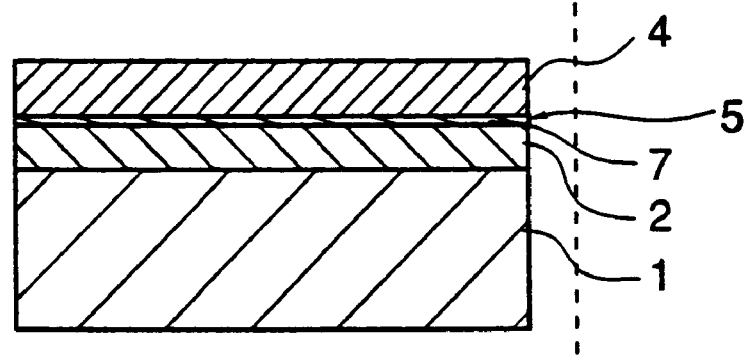

sample C

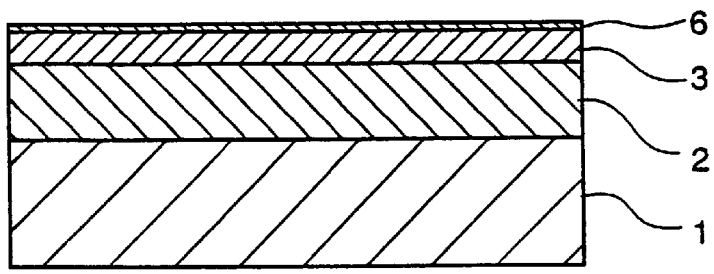
Fig.11 (a) (PRIOR ART)
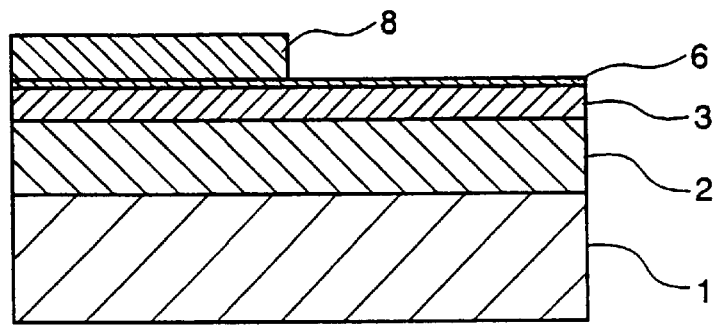
Fig.11 (b) (PRIOR ART)
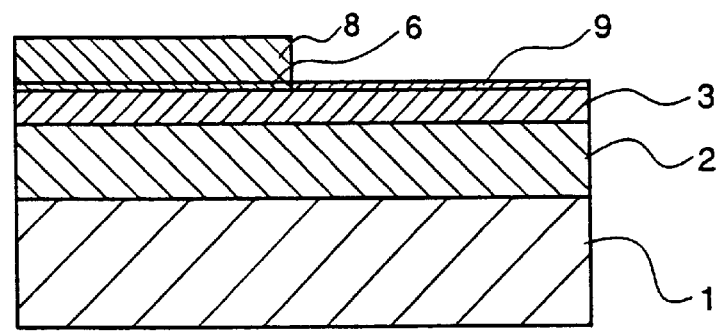
Fig.11 (c) (PRIOR ART)
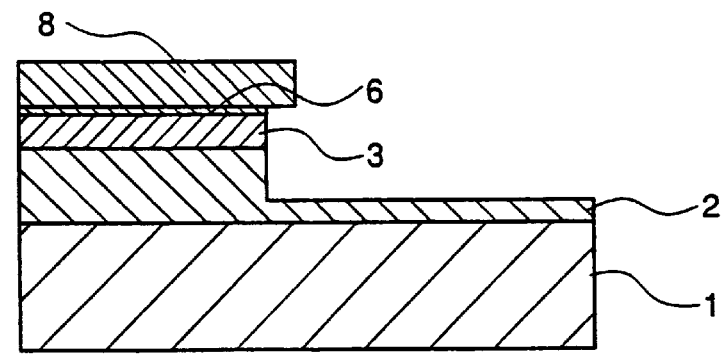
Fig.11 (d) (PRIOR ART)
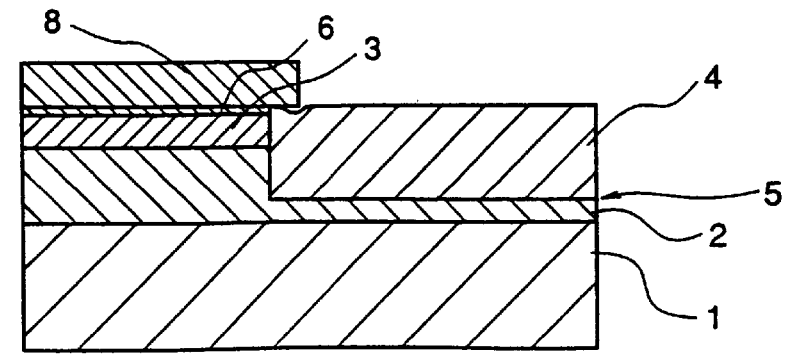
Fig.11 (e) (PRIOR ART)

METHOD OF FABRICATING A SEMICONDUCTOR DEVICE AND METHOD OF CLEANING A CRYSTALLINE SEMICONDUCTOR SURFACE

FIELD OF THE INVENTION

The present invention relates to fabrication of a semiconductor device, to cleaning of a semiconductor crystal surface, and to a semiconductor device. More particularly, this invention relates to a combined process of dry-etching and epitaxial growth, to a method of removing an oxide film on an semiconductor crystal surface, and to a semiconductor device fabricated employing the complicated process and the cleaning method.

BACKGROUND OF THE INVENTION

Recently, progress is being made in compound semiconductor devices, for example, semiconductor lasers and heterojunction bipolar transistors, which are key devices for today's highly advanced information society. The research and development for these compound semiconductor devices have been performed so that the devices have a finer structure, and are more complicated. This suggests that the a process combining fabrication of a fine structure by dry-etching and epitaxy should be a key technology essential in fabrications of compound semiconductor devices in the near future. In Si-LSI, which go on higher integration, the super clean technology utilizing complicated processing or the research on new device structures have top priority.

In the complicated process comprising dry-etching and epitaxy where a portion of a crystal is selectively etched and an epitaxial layer having different electrical and optical properties is regrown thereon control of the cleanness of the regrowth interface and maintenance of cleanliness of the regrowth interface remains as one of the most important problems to be solved. In particular, a compound semiconductor material including Al as constituent, such as AlGaAs, is easily oxidized on its surface when exposed to the atmosphere and once this happens, it is extremely difficult to clean the surface of AlGaAs oxidized thereby. Therefore, it is difficult to grow a high quality crystal on the oxidized surface of AlGaAs by epitaxial regrowth, resulting in a poorer quality of regrown semiconductor layer in terms of electrical and optical characteristics.

In regard to the situation described above, those who have invented the present invention have investigated the complicated process comprising dry-etching and epitaxial growth in many aspects, and they have proceeded the understanding of the degree of cleanliness of the regrowth interface and have provided improved techniques. For example, the inventors of the present invention disclosed, in pp. 35–42 of Journal of Crystal Growth 134 (1993), a method in which a GaAs cap layer is formed on AlGaAs, the sample is subjected to HCl gas etching at 750° C. and thereafter, epitaxial regrowth is carried out thereon. This method aims at suppressing oxidation of AlGaAs surface to the utmost. This method includes forming GaAs cap layer formed on the AlGaAs, HCl gas etching is started at 750° C. from the GaAs cap layer to reach the AlGaAs layer, and thereafter, regrowth in the same chamber so that accumulation of oxide on the regrowth interface is avoided. In the HCl gas etching of the AlGaAs oxidized surface at 750° C., residual oxide remains on the surface after the etching therefore, although that regrowth by MOCVD is performed in the same chamber after etching, the crystal quality of the regrown GaAs layer could be poor. According to the method described above, however, residual oxide is reduced by the factor of 1/5 as compared with the oxidized AlGaAs layer being etched, and the crystalline quality of the regrown GaAs layer is also significantly improved. It was also pointed out that the flow rate of $AsH_3$ used for the etching is important.

However, it is found that these methods described above are not sufficient to assure the complete removal of residual impurities from the regrowth interface. This is because the HCl gas etching at the high temperature of 750° C. is not able to completely remove the oxide, thus leaving oxides on the surface after the etching.

As is made apparent from the above-described examination result, as described on pp. 35–42 of Journal of Crystal Growth 134 (1993), when a preferable epitaxial growth is to be performed in the same chamber on the AlGaAs layer on which the HCl gas etching has been performed, it is necessary to provide a GaAs cap layer on the AlGaAs layer. However, it is insufficient to adopt only the cap layer and it is indispensable to perform surface cleaning of the GaAs cap layer. In other words, it is quite difficult to maintain the degree of cleanliness of the regrowth interface only by performing the complicated process including dry-etching and epitaxial growth by successively performing each in the same chamber or by performing them in a system for transferring a wafer between two mutually connected chambers without exposing the wafer to the atmosphere. This means that it is indispensable to use the surface cleaning jointly with the above-described complicated process.

FIG. 11 illustrates a fabrication method that is intended to solve the above-described problems. This method was invented by the inventors of the present invention and is disclosed in Japanese Published Patent Application Hei. 5-44869. Reference numeral 1 designates a GaAs substrate, reference numeral 2 designates an AlGaAs layer, reference numeral 3 designates a GaAs cap layer, reference numeral 4 designates a regrown GaAs layer, reference numeral 5 designates a regrowth interface, reference numeral 6 designates an oxide film formed on the GaAs cap layer 3, reference numeral 8 designates a SiN film pattern, and reference numeral 9 designates a sulfur film.

The fabrication method of the prior art semiconductor device will be described as follows. First, the AlGaAs layer 2 2 $\mu$m thick and the GaAs cap layer 3 0.1 $\mu$m thick are successively grown by MOCVD on the GaAs substrate 1. Then the sample is taken out of the chamber and is kept in the atmosphere for several days, during which period a thin oxide film 6 is formed on the GaAs cap layer 3. FIG. 11(a) shows the sample thus prepared. Then, an SiN film pattern 8 of a desired configuration is formed on the sample surface as shown in FIG. 11(b). Next, the sample is treated in an ammonium sulfide solution. In this example, $(NH_4)_2S$ is used as the ammonium sulfide solution and the sample is treated at 60° C. for 3 hours. During that time, a portion of the GaAs cap layer 3 not covered with the SiN film pattern 8 is etched away and the sulfur film 9 is formed as shown in FIG. 11(c). Next, the sample is set in the MOCVD chamber and is treated in a hydrogen environment at 450° C. for 30 minutes. Then, as shown in FIG. 11(d), the sample is etched for 1 $\mu$m with a mixture of arsine ($AsH_3$), HCl, and $H_2$ using the SiN film pattern as the etching mask. Finally, the GaAs layer 4 is formed in the same chamber to produce the semiconductor device as shown in FIG. 11(e).

In the conventional method described above, the treatment with the ammonium sulfide removed the oxide film 6 and created the sulfur film 9 on the surface of the sample, thereby functioning to suppress further surface oxidation, and the sulfur film 9, the GaAs cap layer 3, and the portion of AlGaAs layer 2 are etched with HCl etching, and thereafter, the GaAs layer 4 is grown. This procedure does not cause oxidation on the regrowth interface 5, thereby improving both the degree of cleanliness of the regrowth interface 5 and the crystallinity of the regrown GaAs layer 4.

Another conventional method employing an ECR (Electron Cyclotron Resonance) plasma using hydrogen in which cleaning of the GaAs surface is performed at 300° C. is disclosed by Kondo et. al., in Japanese Journal of Applied Physics, Vol. 28, No. 1, January, 1989, pp. L7–L9. This method is very effective in cleaning the GaAs surface.

As discussed above, when the prior art complicated process of dry-etching and recrystallization growth is to be performed, it is thought of combining the treatment with the ammonium sulfide and the treatment in an ECR plasma to clean the surface of semiconductor materials and to get rid of impurities such as oxide films. However, the treatment with the ammonium sulfide requires skilled expertise based on experience and, therefore, will not easily be applied to a mass production scheme. It is also hard to maintain the purity of the ammonium sulfide solution, resulting in the inability to achieve a desired result.

The problem for employing the ECR plasma treatment is that it requires the construction of a special apparatus which combines an ECR plasma chamber and an epitaxial growth chamber. It has been shown that this technology could not be easily applied to a typical mass production facility.

SUMMARY OF THE INVENTION

It is an object of the present invention to provide a method of fabricating a semiconductor device which enables easily decreasing the impurities on the regrowth interface.

It is another object of the present invention to provide a simple but effective method of cleaning a crystalline surface of a semiconductor which perfectly removes thin oxide films formed on the crystalline surface of the semiconductor material.

It is yet another object of the present invention to provide a semiconductor device with a low concentration of impurities on a regrowth interface.

Other objects and advantages of the present invention will become apparent from the detailed description that follows. The detailed description and specific embodiments described are provided only for illustration since various additions and modifications within the scope of the invention will be apparent to those of skill in the art from the detailed description.

According to a first aspect of the present invention, a fabrication method of a semiconductor device comprises successively growing a semiconductor layer made of a compound semiconductor containing Al as a constituent and a cap layer made of a compound semiconductor not containing Al by crystal growth on a semiconductor substrate; placing the cap layer not containing Al and the semiconductor layer containing Al in a gaseous environment including a halogen gas with the temperature maintained at 450° C. or below so that an oxide film naturally formed on the crystalline surface of the cap layer is removed through a continual adsorption and desorption reaction between the oxide film and gas molecules of the halogen gas; replacing the gaseous environment, without allowing the cap layer to be exposed to an atmospheric environment, with the one for dry-etching the cap layer and the semiconductor layer containing Al, or the cap layer, the semiconductor layer containing Al, and the semiconductor substrate, so that the cap layer and the semiconductor layer containing Al, or the cap layer, the semiconductor layer containing Al, and the semiconductor substrate are dry-etched in the direction perpendicular to the surface from which the oxide film on the cap layer was removed until the semiconductor layer containing Al or the semiconductor substrate are reached; and replacing the gaseous environment for dry-etching, without allowing the crystalline surface of the semiconductor layer which has been exposed due to the dry-etching, with an environment for crystal growth so that another semiconductor layer is grown on the crystalline surface of the semiconductor which was exposed by dry-etching. Therefore, it is possible to grow the semiconductor layer after cleaning the crystalline surface of the semiconductor layer which was exposed due to the dry-etching. It is also possible to have a cleaner regrowth interface and to improve the crystallinity of the regrowth layer.

According to a second aspect of the present invention, in the above described fabrication method of a semiconductor device, the semiconductor layer containing Al is AlGaAs, the cap layer is GaAs, and the gas including the halogen gas is a mixture gas of HCl, hydrogen, and $AsH_3$. Therefore, it is possible to grow the semiconductor layer by crystal growth after the crystalline surface of the semiconductor layer which was exposed due to the dry-etching is cleaned. It is also possible to grow another semiconductor layer after finishing the cleaning of the crystalline surface of the semiconductor layer which was exposed due to the dry-etching. It is also possible to have cleaner regrowth interface and to improve the crystal growth of the other semiconductor layer.

According to a third aspect of the present invention, in the above described fabrication method of a semiconductor device, the cap layer is made of a III–V compound semiconductor and the gas including a halogen gas includes the gas which contains the Group V element constituting the cap layer. Therefore, it is possible to have control over the desorption of the Group V element from the crystalline surface of the cap layer during the removal of the oxide film from the cap layer surface. It is also possible to have a cleaner regrowth interface and to improve the crystallinity of another semiconductor layer.

According to a fourth aspect of the present invention, in the above described fabrication method of a semiconductor device, the halogen gas is HCl gas.

According to a fifth aspect of the present invention, in the above described fabrication method of a semiconductor device, the dry-etching of the cap layer and the semiconductor layer containing Al, or the cap layer, the semiconductor layer containing Al, and the semiconductor substrate is performed by gas etching, using a gas of the same composition as the gas including the halogen gas. Therefore, when shifting from the removal of the oxide film from the crystalline surface of cap layer to the dry-etching process of the cap layer and the semiconductor layer containing Al, or of the cap layer, the semiconductor layer containing Al, and the semiconductor substrate, it is unnecessary to replace one gas with another, thus improving work efficiency.

According to a sixth aspect of the present invention, in the above described fabrication method of a semiconductor device, the semiconductor layer containing Al comprises a plurality of layers including a layer containing Al as a constituent.

According to a seventh aspect of the present invention, a fabrication method of a semiconductor device comprises placing a first semiconductor layer under a gaseous environment including a halogen gas with a temperature maintained at 450° C. or below so that an oxide film naturally formed on a crystalline surface of the first semiconductor layer is removed through a continual adsorption and desorption reaction between the oxide film and gas molecules of the halogen gas; and replacing the gaseous environment including the halogen gas, without allowing the first semiconductor layer to be exposed to an atmospheric environment, with the one for a crystal growth so that a second semiconductor layer grows on the crystalline surface of the first semiconductor layer from which the oxide film was removed. Therefore, it is possible to have a crystal growth of the second semiconductor layer after finishing the cleaning of the crystalline surface of the first semiconductor. It is also possible to have a cleaner regrowth interface and to improve the crystallinity of the second regrown semiconductor layer.

According to an eighth aspect of the present invention, a fabrication method of the semiconductor device comprises placing a first semiconductor layer under a gaseous environment including a halogen gas with a temperature maintained at 450° C. or below so that an oxide film naturally formed on a crystalline surface of the first semiconductor layer is removed through a continual adsorption and desorption reaction between the oxide film and gas molecules of the halogen gas; replacing the gaseous environment containing the halogen gas, without allowing the first semiconductor layer to be exposed to an atmospheric environment, with the one for dry-etching so that the first semiconductor layer is dry-etched in the direction perpendicular to the surface from which the oxide film has been removed; and replacing the gaseous environment for the dry-etching, without allowing the first semiconductor layer to be exposed to the atmospheric environment, with the one for a crystal growth so that a second semiconductor layer grows by crystallization on the crystalline surface of the first semiconductor layer which was exposed due to the dry-etching process. Therefore, it is possible to grown the second semiconductor layer after finishing the cleaning of the crystalline surface of the first semiconductor layer after the dry-etching. It is also possible to have a cleaner regrowth interface and to improve the crystallization of the second regrown semiconductor layer.

According to a ninth aspect of the present invention, in the above described fabrication method of a semiconductor device, the first semiconductor layer consists of a III–V compound semiconductor and the gas containing the halogen gas includes a gas which contains a Group V element that is a constituent of the first semiconductor layer. Therefore, it is possible to have control over the desorption of the Group V element from the crystalline surface of the first semiconductor layer during the removal of the oxide layer from the crystalline surface of the first semiconductor layer. It is also possible to have a cleaner regrowth interface and to improve the crystallization of the second regrowing semiconductor layer.

According to a tenth aspect of the present invention, in the above described fabrication method, the halogen gas comprises HCl gas.

According to an eleventh aspect of the present invention, in the above described fabrication method of the semiconductor device, the dry-etching of the first semiconductor layer is performed by gas-etching using a gas of the same composition of the gas containing the halogen gas. Therefore, when shifting from the removal process of the oxide film from the crystalline surface of the first semiconductor layer to the dry-etching process of the first semiconductor layer, it is unnecessary to replace one gas with another, thus improving work efficiency.

According to a twelfth aspect of the present invention, a semiconductor device is fabricated by forming successively a semiconductor layer made of a compound semiconductor containing Al as its constituent and a cap layer made of a compound semiconductor not containing Al by crystal growth on a semiconductor substrate; then placing them under a gaseous environment containing a halogen gas with a temperature maintained at 450° C. or below so that an oxide film naturally formed on a crystalline surface of the cap layer is removed through a continual adsorption and desorption reaction between the oxide film and gas molecules of the halogen gas; replacing the gaseous environment including the halogen gas, without allowing the cap layer to be exposed to an atmospheric environment, with the one for dry-etching the cap layer and the semiconductor layer containing Al, or the cap layer, the semiconductor layer containing Al, and the semiconductor substrate, so that the cap layer and the semiconductor layer containing Al, or the cap layer, the semiconductor layer containing Al, and the semiconductor substrate are dry-etched in the direction perpendicular to the surface from which the oxide film was removed until the semiconductor layer containing Al or the semiconductor substrate are reached; and replacing the gaseous environment for the dry-etching, without allowing the crystalline surface of the semiconductor layer to be exposed to the atmospheric environment which was exposed due to the dry-etching process, with the one for crystal growth so that another semiconductor layer grows by crystallization on the crystalline surface of the semiconductor which has been exposed due to the dry-etching process. Therefore, it is possible to provide a semiconductor device having a high degree of cleanliness at the regrowth interface and having an excellent crystalline property of the regrowth layer.

According to a thirteenth aspect of the present invention, for the above described semiconductor device, the semiconductor layers containing Al as a constituent comprise a plurality of layers which contain a layer having Al as its constituent.

According to a fourteenth aspect of the present invention, a semiconductor device is fabricated by placing a first semiconductor layer under a gaseous environment including a halogen gas with a temperature maintained at 450° C. or below so that an oxide film naturally formed on a crystalline surface of the first semiconductor layer is removed through a continual adsorption and desorption reaction between the oxide film and gas molecules of the halogen gas; and replacing the gaseous environment, without allowing the first semiconductor layer to be exposed to an atmospheric environment, with the one for crystal growth so that a second semiconductor layer grows by crystallization on the crystalline surface of the first semiconductor layer from which the oxide was removed. Therefore, it is possible to provide a semiconductor device having a high degree of cleanliness at the regrowth interface and of an excellent crystalline property having the regrowth layer.

According to a fifteenth aspect of the present invention, a semiconductor device is fabricated by placing a first semiconductor layer under a gaseous environment including a halogen gas with a temperature maintained at 450° C. or below so that an oxide film naturally formed on the crystalline surface of the first semiconductor is removed through a continual adsorption and desorption reaction between the oxide film and gas molecules of the halogen gas; replacing the gaseous environment, without allowing the first semiconductor layer to be exposed to an atmospheric environment, with the one for dry-etching the first semiconductor layer, so that the first semiconductor layer is dry-etched in the direction perpendicular to the surface from which the oxide film was removed; and replacing the gaseous environment for the dry-etching, without allowing the first semiconductor layer to be exposed to the atmospheric environment, with the one for a crystal growth so that the second semiconductor layer grows by crystallization on the crystalline surface of the first semiconductor layer. Therefore, it is possible to provide a semiconductor device having a high degree of cleanliness at the regrowth interface and having an excellent crystalline property of the regrowth layer.

According to a sixteenth aspect of the present invention, a cleaning method including placing a semiconductor layer under a gaseous environment including a halogen gas with a temperature maintained at 450° C. or below so that an oxide film naturally formed on the crystalline surface of the semiconductor layer is removed through a continual adsorption and desorption reaction between the oxide film and gas molecules of the halogen gas. Therefore, it is possible having provide a semiconductor crystalline surface of a high degree of cleanliness.

According to a seventeenth aspect of the present invention, in the above described cleaning method of a crystalline surface of a semiconductor, the semiconductor layer is a III–V compound semiconductor, and the gas including the halogen gas includes a gas which contains the Group V element constituting the semiconductor layer. Therefore, it is possible to have control over the desorption of the Group V element from the crystalline surface of the first semiconductor layer during the removal of the oxide film from the crystalline surface and to provide a semiconductor crystalline surface having excellent crystallinity.

According to an eighteenth aspect of the present invention, in the above described cleaning method of a crystalline surface of a semiconductor, the halogen gas comprises HCl gas.

According to a nineteenth aspect of the present invention, a semiconductor device is fabricated by placing a semiconductor layer under a gaseous environment including a halogen gas with a temperature maintained at 450° C. or below so that an oxide film naturally formed on a crystalline surface of the semiconductor layer is removed through a continual adsorption and desorption reaction between the oxide film and gas molecules of the halogen gas. Therefore, it is possible to provide a semiconductor device having a high degree of cleanliness at a regrowth interface and having an excellent crystalline regrowth layer.

BRIEF DESCRIPTION OF THE DRAWINGS

FIGS. 1(a) and 1(b) are graphs showing the results of SIMS analyses of a surface cleaned in accordance with a first embodiment of this invention.

FIGS. 2(a)–2(d) are cross-sectional views showing a fabrication method of a semiconductor device in accordance with the first embodiment of this invention.

FIGS. 9(a)–9(c) are cross-sectional views showing a prior art fabrication method of a semiconductor device.

FIGS. 11(a)–11(e) are cross-sectional views showing a prior art fabrication method of other semiconductor devices.

DETAILED DESCRIPTION OF THE PREFERRED EMBODIMENTS

[EMBODIMENT 1]

A method of fabricating a semiconductor device according to the first embodiment of the present invention will be described as follows. In this first embodiment, layers of semiconductors having an outermost layer that is the cap layer (the protective layer) receives the low temperature HCl treatment, followed by dry-etching and an epitaxial growth in succession.

Figure 10:
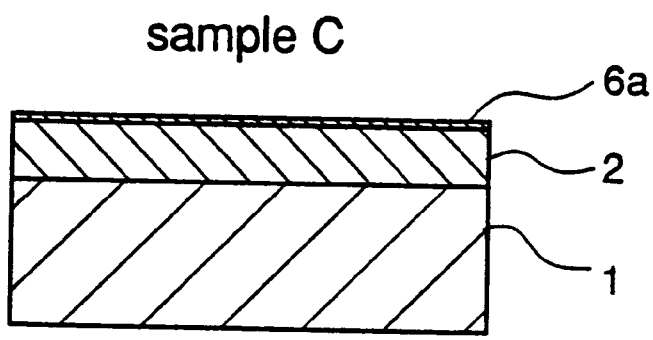
FIGS. 10(a)–10(c) are cross-sectional views showing a prior art fabrication method of a semiconductor device.
Figure 10:
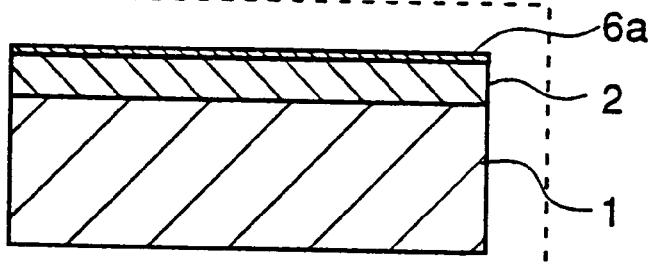
Figure 10:
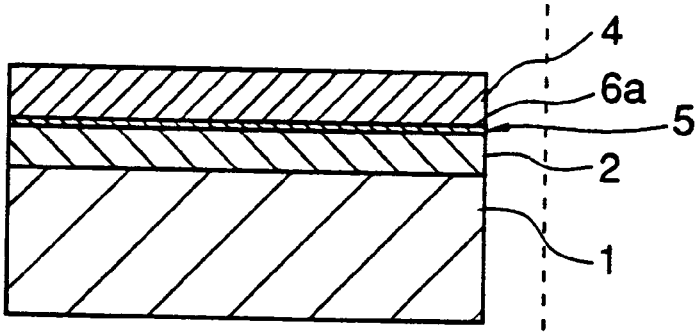

FIGS. 2(a)–2(d), 9(a)–9(c), and 10(a)–10(c) show structures of samples used in experiments which have demonstrated the effective method of preventing impurity deposition on a regrowth interface in the first embodiment. FIGS. 2(a)–2(d) show a sample A which was prepared through a combined process according to the first embodiment of the present invention. In this figure, reference numeral 1 designates a GaAs substrate, reference numeral 2 designates an AlGaAs layer, reference numeral 3 designates a GaAs cap layer, reference numeral 4 designates a GaAs regrown layer, reference numeral 5 designates a regrowth interface, and reference numeral 6 designates a thin oxide film formed on the GaAs cap layer. FIGS. 9(a)–9(c) show a sample B which was prepared through a combined process of dry-etching and epitaxial growth according to the prior art, where the reference numerals designating each of the elements refer to like or corresponding elements found in FIGS. 2(a)–2(d) and reference numeral 7 designates a degraded oxidized layer formed on the regrowth interface due to the oxide film 6. FIGS. 10(a)–10(c) show a sample C which was prepared through another combined process of dry-etching and epitaxial growth according to the prior art, where 6a is a thin oxide film formed on a surface of the AlGaAs layer 2 and other reference numerals designating elements refer to the like or corresponding elements found in FIGS. 2(a)–2(d). For these three figures, areas enclosed with a dashed line indicate those processes which were successively carried out in the MOCVD (metal organic chemical vapor deposition) chamber.

Figure 3:
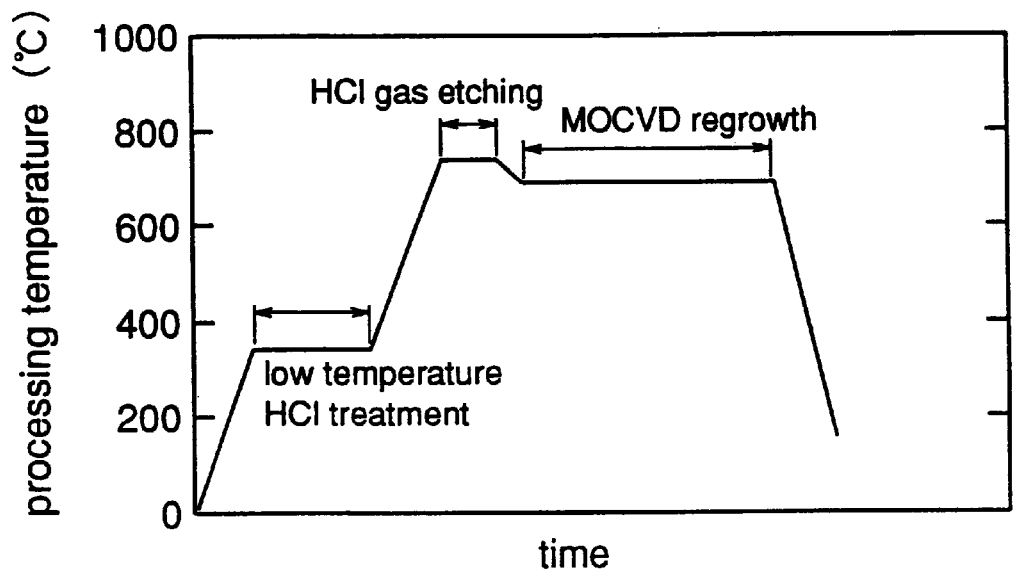
FIG. 3 is a graphical representation showing an example of the growth sequence in accordance with the first embodiment of this invention.
Figure 4:
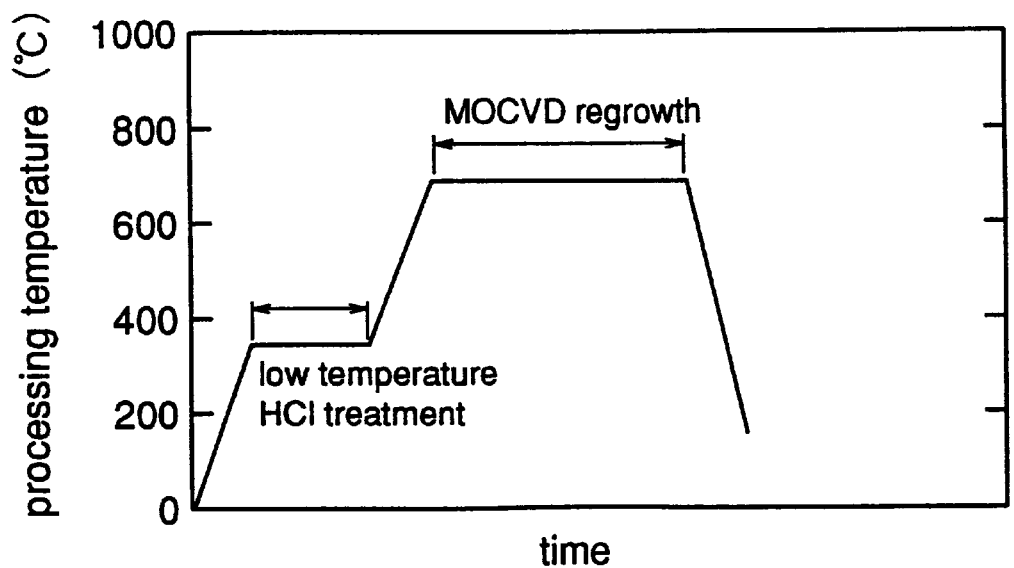
FIG. 4 is a graphical representation showing an example of the growth sequence in accordance with a second embodiment of this invention.
Figure 8:
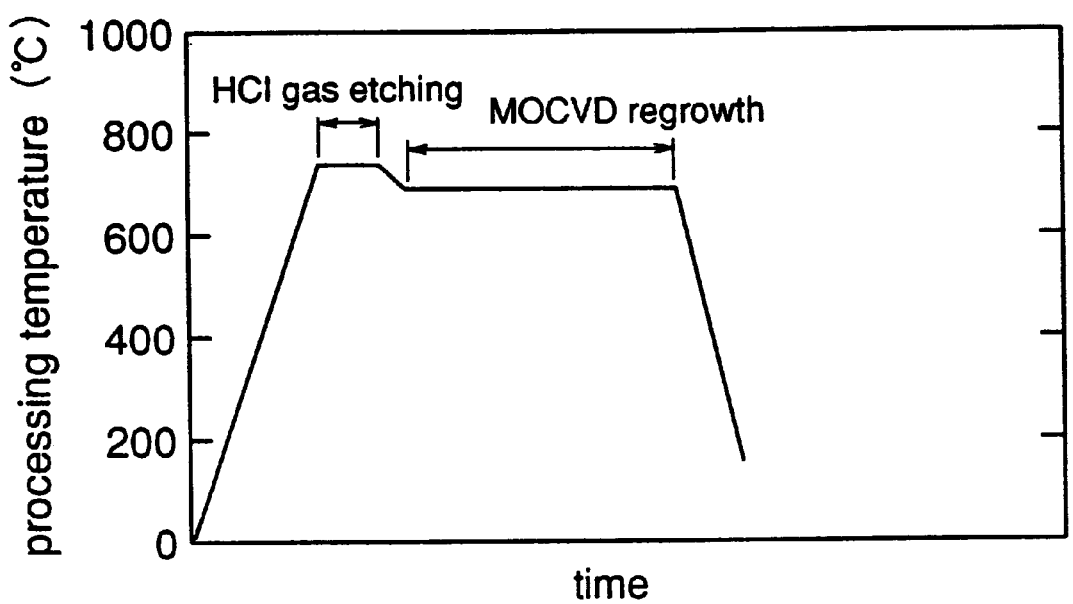
FIG. 8 is a graphical representation of the growth sequence of the complicated process of conventional dry-etching and epitaxial growth.

FIG. 3 shows an example of a growth sequence of the sample A while being prepared within the MOCVD chamber. Similarly, FIG. 8 shows an example of the growth sequence of samples B and C while being prepared within the MOCVD chamber.

Next, methods of preparing the individual samples will briefly be described. First, the preparation of the sample A will be described with reference to FIGS. 2(a)–2(d). The layer 2 of $Al_xGa_{1-x}As$ (x=0.48) having a thickness of 2 $\mu$m and the cap layer 3 having GaAs of a thickness of 0.1 $\mu$m are successively grown on the GaAs substrate using the MOCVD method (FIG. 2(a)). Next, this sample is exposed to an atmospheric environment, and then washed with water and left so as to dry, during which process the thin oxide film 6 of a thickness on the order of several angstroms is established.

Then, this sample is again placed inside the MOCVD chamber, where the sample is heated up to 350° C. under a gaseous environment comprising hydrogen and $ASH_3$, and then the sample is treated under the gaseous environment now comprising hydrogen gas, $AsH_3$ and HCl for a duration of 100 minutes, so that the thin oxide film 6 formed on the cap layer 3 is removed (FIG. 2(b)). The removal of the oxide film 6 around the cap layer is due to a continual adsorption and desorption reaction of halogen gas molecules such as HCl with the oxide film. This process is called the low temperature HCl treatment. The temperature for the low temperature HCl treatment may be 450° C. or below. The oxide film 6 on the GaAs cap layer 3 is completely removed by the low temperature HCl treatment. This low temperature HCl treatment has been performed with flow rates of 2.5 slm (standard litters per minute) for hydrogen, 10 sccm for $AsH_3$(20%), and 40 sccm for HCl(10%). $AsH_3$ was added in order to control a loss of As from the surface of the GaAs cap layer during the low temperature HCl treatment. Other gases having As as their constituents such as the tetrabutylarsine ($C_4H_9AsH_2$) can be used for this purpose. In this embodiment, the $AsH_3$/HCl ratio is 0.5, which is an optimized flow rate in the case of improving the surface state in the HCl gas etching as disclosed in the Japanese Published Patent Application Hei. 5-44869. After the oxide film 6 is completely removed by means of the low temperature HCl treatment, the GaAs cap layer is etched with HCl gas. During the processing time in this embodiment, about 100 Å of etching is performed.

Next, the sample which was finished by the low temperature HCl treatment is heated up to a temperature of 750° C. in order to be etched using a conventional gas etching technique, flow rates of hydrogen, $AsH_3$, and HCl being maintained at the same rates for the previous low temperature HCl treatment (FIG. 2(c)). An etching depth of 0.8 $\mu$m is to be achieved with this HCl gas etching, so that it reaches the AlGaAs layer 2.

Then, the sample which was finished by the etching process is subjected to the MOCVD growth, where the GaAs layer 4 is made to regrow, and we get the sample A (FIG. 2(d)). The low temperature HCl treatment and the regrowing process of the GaAs layer are successively performed within the same chamber, a growth sequence of which is shown in FIG. 3.

Next, the fabrication method of sample B will be described. The layer 2 of $Al_xGa_{1-x}As$ (x=0.48) having a thickness of 2 $\mu$m and the cap layer 3 of GaAs having a thickness of 0.1 $\mu$m are successively formed on a GaAs substrate 1 having a thickness of 2 $\mu$m using the MOCVD method. Next, this sample is exposed out to the atmospheric environment, and then washed with water and left so as to dry, during which process the thin oxide film 6 of a thickness on the order of several angstroms is established. The sample is again placed in the MOCVD chamber, where the sample is heated up to 750° C. and is etched using the HCl etching procedure (FIG. 9(b)). The flow rates of the hydrogen, $AsH_3$, and HCl for this gas etching process are the same as those for the sample A. Maintaining the values for the parameters described above, 0.8 $\mu$m of etching is performed. In this case, there remains a portion of the oxide film 6 on the surface of the AlGaAs layer 2 after the etching.

Furthermore, the GaAs layer 4 is made to regrow on the sample which was finished by the etching using the MOCVD method (FIG. 9(c)). This regrowth process produces a degraded layer 7 due to oxidation, originated from the oxide film 6. The HCl gas etching process and the regrowing process for the GaAs layer 4 are successively performed within the same chamber, a growth sequence of which is shown in FIG. 8.

Next, the fabrication method of sample C will be described. The layer 2 of $Al_xGa_{1-x}As$ (x=0.48) 2 $\mu$m thick is formed on the GaAs substrate 1 2 $\mu$m thick using the MOCVD method (FIG. 10(b)). This sample is exposed to the atmospheric environment, and then washed with water and left so as to dry, during which process the thin oxide film 6a is established. The sample is again placed in the MOCVD chamber, where the sample is heated up to 750° C. and etched using the HCl etching procedure (FIG. 10(b)). The flow rates of the hydrogen, $AsH_3$, and HCl for this gas etching process are the same as those for the sample A. Using the same conditions described above, 0.8 $\mu$m of etching is performed. In this case, the oxide film 6a is rarely etched. Only the AlGaAs layer 2 is etched, leaving the oxide film 6a on the surface of the AlGaAs layer 6.

Furthermore, the GaAs layer 4 is regrown on the sample which was finished by the etching using the MOCVD process (FIG. 10(c)). The HCl gas etching process and the regrowing process for the GaAs layer 4 are successively performed within the same chamber, the growth sequence of which is the same for the sample B and shown in FIG. 8.

Next, results of analyses on the impurities (oxygen, carbon) that are found on the regrowth interfaces 5 of the AlGaAs layer 2 for each sample will be described. Here, the analyses of the impurities found in the samples were performed using SIMS and the dislocation density of the regrown GaAs layer 4 was evaluated by the etch-pit observation method using molten KOH.

FIGS. 1(a) and 1(b) show the results of the analyses of the impurities on the regrowth interface 5, FIG. 1(a) for carbon and FIG. 1(b) for oxygen. As indicated in the figures, carbon and oxygen are found on the regrowth interface 5, making it a "dirty" surface, in samples B and C, respectively. Further analyses of the dislocation density of the samples B and C revealed that the sample C has a dislocation density of $5 \times 10^8/cm^2$, presenting deteriorated crystal quality. The sample B has a better value compared to sample C due to the GaAs cap layer, having a dislocation density of $4 \times 10^4/cm^2$. However, it is necessary that a dislocation density in a semiconductor device be below $10^4/cm^2$. Therefore, a crystal having a dislocation density of $4 \times 10^4/cm^2$ is not suitable for semiconductor devices which are required to have high performance characteristics, and its use will be quite limited.

On the other hand, the analyses of the sample A which was fabricated according to the first embodiment of this invention reveal that there are no impurities found on the regrowth interface 5, and it was confirmed that a high degree of cleanliness is obtained. The analysis of the dislocation density revealed it as $1\times10^3/cm^2$, indicating that crystals of very high quality were obtained. Because the dislocation density of the GaAs substrate is about $500/cm^2$ and an epitaxial layer successively formed by the MOCVD method is about $1\times10^3/cm^2$, the above-described value means that the sample has quite high quality as a sample which was fabricated through the regrowth process after the etching process, and it is also suggested that both the cleanliness of the regrowth interface and the crystallinity of regrown crystalline layer are not inferior to a sample which is fabricated through successive growth. The above result has been achieved for the first time for the AlGaAs sample containing Al having a composite ratio of 0.48, which is very likely to be oxidized.

The fact that no impurities are found on the regrowth interface, thereby achieving a high quality regrowth crystal layer in this first embodiment, can be described as follows. In the prior art, the combined process of dry-etching and crystal regrowth requires that a sample be heated up to 450° C. or above, and, as described in Kondo et al., 19th International Symposium on GaAs and Related Compounds (1992; Karuizawa), this results in transformation of the oxide on the surface of semiconductor material, such as $Al_2O_3$ and $Ga_2O_3$, into extremely firm and non-volatile compounds which solidify on the surface. When this happens, it is almost impossible to remove the compounds. Even when etching is started ignoring the above mechanism, the oxide films 6 and 6a which were solidified on the surface cannot be removed. Only the semiconductor layers under the oxide films 6 and 6a are etched and removed as shown in FIG. 9(*a*) and FIG. 10(*a*). Even when the etching process progresses, those oxides 6 and 6a remain on the surface as shown in FIGS. 9(*b*) and 10(*b*). In the sample C having the AlGaAs layer 2 on the surface, once the oxide 6a is combined with Al, an aluminum oxide having an extremely strong bonding results, and this aggravates the crystal quality of the regrowth layer. The reason why an acceptable result was not obtained for the sample B is that the oxide 6 on the GaAs cap layer 3, at a high temperature during HCl gas etching, is transformed into a hard compound which is not likely to be etched by the gas etching. This compound remains even after the gas etching, and the oxygen contained in this compound causes the oxidation of the surface of the AlGaAs layer 2, creating the degraded oxidized layer 7 in the vicinity of the regrowth interface 5. In other words, it is necessary to completely remove the oxide layer 6, that is, remove the oxygen, from the surface of the GaAs cap layer 3 before the HCl gas etching so that the AlGaAs will not be oxidized, when the HCl gas etching progresses and the AlGaAs layer 2 is exposed.

However, as shown for the sample A in this embodiment, the low temperature HCl treatment makes it possible to remove the oxide film 6 on the GaAs cap layer 3 before it is transformed into the stiff compound. It has also been shown that, since after the oxide film 6 on the cap layer 3 is removed by the low temperature HCl treatment, the HCl gas etching is performed, the surface of the AlGaAs layer 2 after the HCl gas etching can be cleaned without any impurities, and this again makes it possible to obtain a high quality crystal growth, resulting in the superior regrowth interface 5. In other words, since the GaAs oxide film, as discussed above, transforms by itself into a compound which has strong bonding when it is heated up to 450° C. or above, a cleaning process at a temperature having 450° C. or below can remove the oxide film from the GaAs cap layer, so that the regrowth interface of superior properties is obtained.

In this first embodiment described above, the GaAs cap layer 3 is formed on the surface of the AlGaAs layer 2, and the sample is isolated from the atmospheric environment, heated up to and maintained at 450° C. or less, and fed with HCl gas, $AsH_3$, and hydrogen gas so that the oxide film is removed. The sample is subjected to dry-etching using HCl gas so that it is etched from the surface of the cap layer 3 until the AlGaAs layer 2 is reached, followed by the crystal regrowth process. This procedure makes the crystallization of the regrowth layer and the cleanliness of the regrowth interface at almost the same level as those which were prepared through successive crystal growth. This makes it possible to easily produce a semiconductor device which exhibits no leakage current and possesses good operating characteristics.

Furthermore, since the regrowth interface can have a high degree of cleanliness, it is possible to provide a regrowth interface on an active region of the semiconductor device, allowing a greater degree of freedom in designing a fabrication process of semiconductor devices.

Furthermore, although, in the first embodiment, AlGaAs is used for the regrowth layer and GaAs for the cap layer, this invention can be also applied effectively as in the first embodiment to cases where other semiconductor materials such as Si, Ge, and III–V compounds are used. It is also possible to omit the cap layer formation process; however, as discussed above, if a material which is likely to be oxidized such as Al is contained within the layer on which the crystal regrowth is to be performed, it would be extremely difficult to remove the oxide film. Therefore, it will be possible to make the whole process more perfect by using a cap layer which does not contain an element such as Al. Furthermore, in the above embodiment, $AsH_3$ gas is supplied during the low temperature HCl treatment in order to prevent surface roughness due to excessive desorption of As. When this invention is applied to other III–V semiconductor materials, a gas which is chosen for the materials undergoing the low temperature HCl treatment and designed to control the desorption of Group V elements should be supplied. For example, if materials containing phosphorus such as InP, GaP, or the like are use phosphine ($PH_3$), the tetrabutylphosphine ($C_4H_9PH_2$), or the like should be supplied. When semiconductor materials containing nitrogen such as GaN are to be used, a gas such as ammonia ($NH_3$) should be supplied.

Furthermore, although, in the first embodiment, the crystal growth is performed on the AlGaAs layer, other layers such as a quantum well structure layer including a layer containing Al, or a layer comprising a laminated structure such as a strained superlattice layer can be used with the same result as in the first embodiment.

Furthermore, in the first embodiment the crystal regrowth is performed on the AlGaAs layer. However, for example, if a layer containing Al as its constituent is disposed on a semiconductor substrate, a cap layer not containing Al is disposed on the layer containing Al, and after the HCl treatment is performed on the surface, dry-etching is performed until it reaches the semiconductor substrate. The desired semiconductor layer is then grown by crystal regrowth on the crystalline surface of the semiconductor substrate exposed by the dry-etching. Therefore, the aluminum oxide that has strong bonding is avoided during the etching of the layer containing Al and the accumulation of the impurities is avoided on the regrowth interface after the dry-etching. The impurities present at the regrowth interface are reduced and a regrowth layer of superior crystal property is obtained.

Furthermore, in this first embodiment, a masking pattern can be placed on the surface of the semiconductor layer before the low temperature HCl treatment so that the low temperature HCl treatment, the dry-etching, and the regrowth are all performed selectively. This gives the same result.

Figure 5:
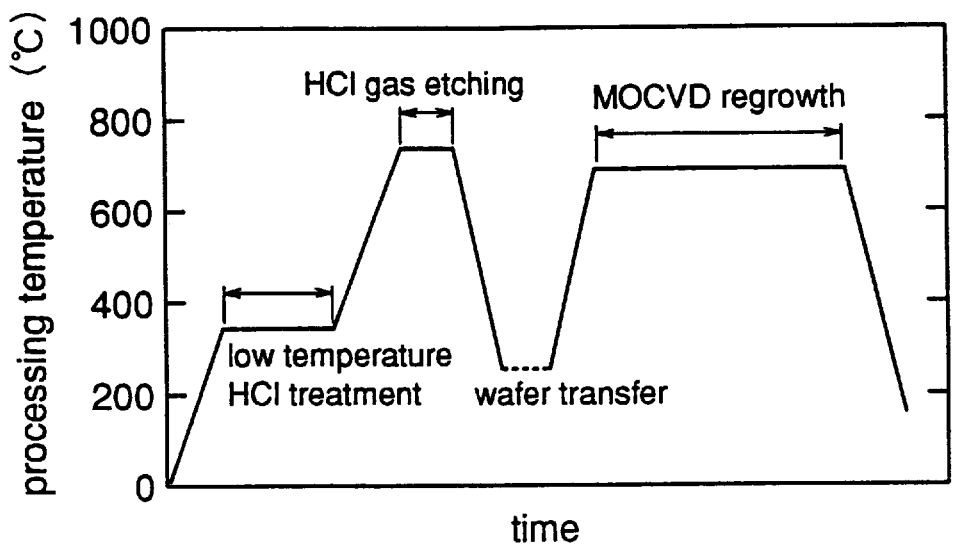
FIG. 5 is a graphical representation showing an example of the growth sequence in accordance with first embodiment of this invention where the wafer is first subjected to the low temperature HCl treatment and to the HCl gas etching, and then is carried to another chamber for crystal regrowth.

Furthermore, although in the first embodiment the low temperature HCl treatment, the HCl gas etching, and the epitaxial regrowth were successively performed as a combined process within the same chamber, it is only required that the semiconductor layers are not exposed to the atmospheric environment between those processes. In other words, it is acceptable that each process possesses its own chamber, those chambers are all connected, and the wafer is carried from one chamber to another under a vacuum or a hydrogen environment or an inert gas environment, so that the wafer in each process is not exposed to the atmospheric environment. For instance, as shown in FIG. 5, it is possible to have such a sequence that the low temperature HCl treatment and the HCl gas etching are performed in one chamber and then the wafer is carried into the regrowth chamber for recrystal growth without the wafer being exposed to the atmospheric environment. This gives the same result.

Furthermore, although in the above first embodiment HCl gas is used in the low temperature treatment so as to remove the oxide film, this invention can be extented to other halogen gases to be used as the etching gases such as HCl, $Cl_2$, etc. of chlorine gas; HBr, $CH_3Br$, etc. of bromine gas; or $CH_3I$, etc. of iodine gas. This gives the same result.

Furthermore, although in the first embodiment the same gas was used both for the low temperature treatment for removal of oxide and for gas etching after the low temperature treatment, it is possible to utilize different gases for these two processes. However, it is desirable to use the same gas for the two processes since there is no need of replacing gases, and the fabrication process becomes simpler.

Furthermore, it is also possible to use other dry-etching after the low temperature treatment such as plasma etching, ion beam etching, or the like, instead of gas etching. This gives the same result.

Furthermore, while in the first embodiment the MOCVD method is used for the crystal regrowth, other methods for the crystal regrowth such as CVD (chemical vapor deposition), MBE (molecular beam epitaxy), GSMBE (gas source molecular beam epitaxy), CBE (chemical beam epitaxy), or the like can be used with the same result obtained.

[EMBODIMENT 2]

The second embodiment of the present invention will be described below. The second embodiment is different from the first embodiment in that it does not have a gas etching process at high temperature but it has a crystal regrowth process immediately after the low temperature HCl treatment. In the first embodiment, a combined process of low temperature HCl treatment, HCl gas etching at high temperature, and the crystal regrowth was described. Now, the reason why the HCl gas etching at high temperature was used in the first embodiment will be described below.

Figure 6:
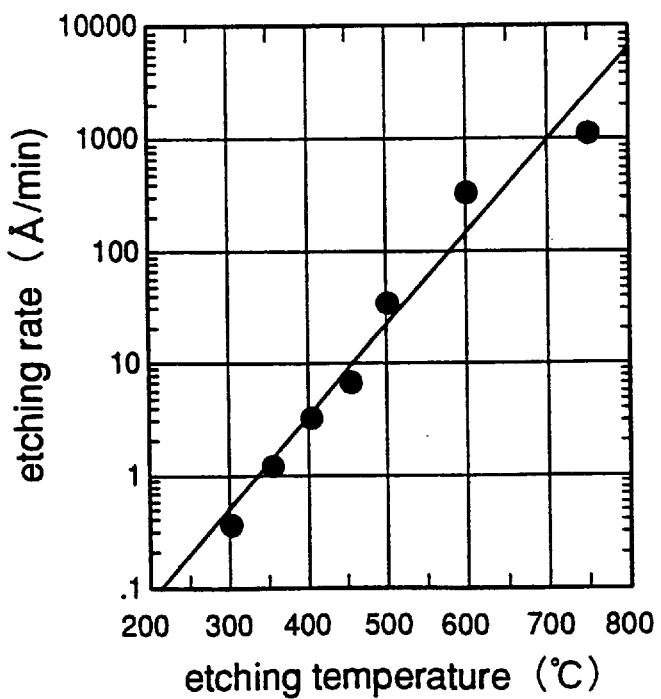
FIG. 6 is a graph showing the relationship between the etching rate and the etching temperature for the GaAs layer in accordance with the second embodiment of this invention.

FIG. 6 shows a relationship between the etching rate and the etching temperature when GaAs is subjected to HCl gas etching. As is shown in the figure, the etching rate increases exponentially with an increase in the temperature. This is due to the fact that a chemical reaction between the etching gas and the semiconductor material is accelerated with a temperature increase. At a temperature suitable for the low temperature HCl treatment, which is 450° C. or below, the etching rate is extremely small, and from FIG. 6, it can be seen that the etching rate at this temperature is less than 10 Å/min. Therefore, it would take a long time until we obtain the desired etching depth (1 μm, for example), and hence it will not be practical to use the surface treatment employing HCl gas at low temperature for etching a semiconductor layer. For this reason, in the first embodiment, the low temperature HCl treatment is limited to the purpose of surface cleaning for removing oxides at the surface, and the high temperature HCl gas etching having a high rate of etching at the temperature of 750° C. was carried out afterward.

However, it sometimes happens in a fabrication process of that an etching depth of 10 to 100 Å is sufficient. Or if the semiconductor layer does not contain elements which have strong bonding such as Al, it is not necessary to produce the cap layer, and consequently, it is not necessary to remove the cap layer. In such a case, high temperature etching having a high rate of etching is not necessary. It is possible to obtain the desired etching by first removing the oxide film with the low temperature HCl treatment, and then etching the sample with the same gas used in the low temperature HCl treatment. In other words, either means is suitable depending on the necessary etching depth and can be used.

Therefore, while isolating the sample from the atmospheric environment, the low temperature HCl treatment described in the first embodiment is applied to the surface of the semiconductor layer, the semiconductor material is etched under the same conditions as the low temperature HCl treatment, and another semiconductor layer is grown by crystal regrowth. Therefore, after removing the impurities on the surface which will become the regrowth interface of the semiconductor layer, the semiconductor layer can be etched without replacing the gas and another semiconductor layer can be grown by crystal regrowth. Hence, the semiconductor device having a clean regrowth and excellent crystallinity of the regrowth layer can easily be produced.

If there is no need for dry-etching after the low temperature HCl treatment, this dry-etching process can be omitted. In other words, the crystal regrowth can be arranged immediately after the low temperature HCl treatment, and a satisfactory result as in the second embodiment can be obtained.

[EMBODIMENT 3]

Fabrication of a heterojunction bipolar transistor (HBT) utilizing the combined process including the low temperature HCl treatment discussed in the first and second embodiments will be described below as the third embodiment of this invention.

FIGS. 7(a)–7(k) show cross sections which illustrate the main steps in fabricating the heterojunction bipolar transistor (HBT) in accordance with the third embodiment of this invention. In the figures, reference numeral 10 designates an semi-insulating. GaAs substrate, reference numeral 11 designates an n+ type GaAs layer, reference numeral 12 designates an n type GaAs layer, reference numeral 13 designates a p+ type AlGaAs base layer, reference numeral 14 designates a p+ type GaAs cap layer, reference numeral 15 designates an SiN film, reference numeral 16 designates a p+ type GaAs external base layer, reference numeral 17 designates a p+ type InGaAs contact layer, reference numeral 18 designates an SiO film, reference numeral 19 designates an n type AlGaAs emitter layer, reference numeral 20 designates an n+ type InGaAs contact layer, reference numeral 21 designates an SiN film, reference numeral 22 designates an opening, reference numeral 23 designates a recess, reference numeral 24 designates an SiN film, reference numeral 25 designates an n+ type GaAs collector terminal, reference numeral 26 designates an n+ type InGaAs contact layer, reference numeral 27 designates a collector electrode, reference numeral 28 designates a base electrode, and reference numeral 29 designates an emitter electrode.

Figure 7:
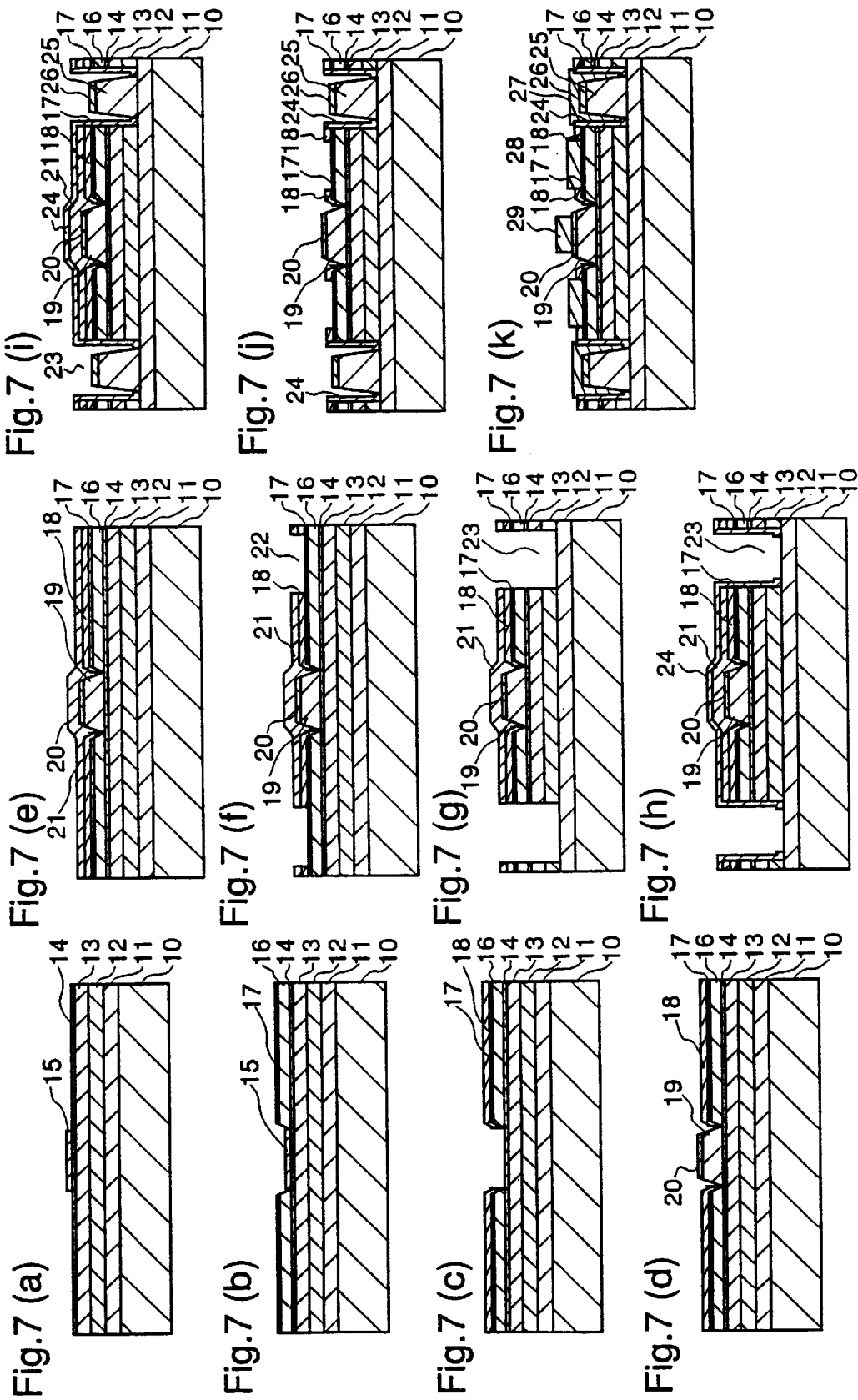
FIGS. 7(a)–7(k) are cross-sectional views showing the fabrication method of a heterojunction bipolar transistor in accordance with a third embodiment of this invention.

The fabrication method according to the third embodiment will be described below. First, the n+ type GaAs layer 11, the n type GaAs layer 12, the p+ type AlGaAs base layer 13, and the p+ type GaAs cap layer 14 are epitaxially grown on the semi-insulating GaAs substrate 10 using the MOCVD method as shown in FIG. 7(a). After depositing the SiN film 15 on the wafer, this SiN film 15 is removed leaving only a portion which has been patterned to be the emitter layer. The p+ type AlGaAs base layer 13 has a in gradual variation such that the side facing the n type GaAs layer 12 is GaAs and the side facing the p+ type GaAs cap layer 14 is $Al_{0.1}Ga_{0.9}As$. Next, the p+ type GaAs external base layer 16 and the p+ type InGaAs contact layer 17 are selectively grown using the SiN film 15 as the selective mask as shown in FIG. 7(b). When this is being performed, by applying the low temperature HCl treatment first and then allowing the selective crystal regrowth to take place, the p+ type GaAs cap layer 14 is cleaned and thus the regrowth interface is maintained at the same degree of cleanliness as would have successively been grown.

Then, as shown in FIG. 7(c), after forming the SiO film 18, the SiN film 15 is removed, creating a portion which will become the emitter later. Furthermore, as shown in FIG. 7(d), the n type AlGaAs emitter layer 19 and the n+ type InGaAs contact layer 20 are selectively grown using the method described in the first embodiment; that is, prior to the selective growth, the low temperature HCl treatment and an HCl gas etching are performed to remove the p+ type GaAs cap layer 14 thus exposing the p+ type AlGaAs base layer 13, and then the n type AlGaAs emitter layer 19 and the n+ type InGaAs contact layer 20 are selectively regrown. If the above mentioned method is not used, a large quantity of oxide is left out on the regrowth interface between the p+ type AlGaAs base layer and the n type AlGaAs emitter layer, which results in degradation of HBT characteristics.

Next, as shown in FIG. 7(e), the SiN film 21 is formed, and as shown in FIG. 7(f), the opening 22 is formed on the SiN film 21 where the collector layer will be formed. Next, as shown in FIG. 7(g), the recess 23 is formed by etching through until it reaches the n+ type GaAs layer 11, using the SiN film 21 as a selective mask. Then, as shown in FIG. 7(h), after forming the SiN film 24 on the entire surface, the only portion in the recess 23 where the collector layer will be grown is opened. Furthermore, as shown in FIG. 7(i), the n type GaAs collector layer 25 and the n+ type InGaAs contact layer 26 are selectively grown. When this is being performed, as described in the first embodiment, if the selective regrowth is performed after the low temperature HCl treatment, the surface of the n+ type GaAs layer 11 is cleaned and the regrowth interface can be maintained at the same degree of cleanliness as it successively grown.

Next, as shown in FIG. 7(j), the SiN films 21 and 24 which were formed together are removed except a portion which is in the close proximity of the side wall of the collector 25. Furthermore, the portion of the SiO film 18 where the base electrode will be located is opened. In above process, the reason why we made selective use of SiN and SiO as an insulating film is to facilitate the selective removal of an insulating film. Next, as shown in FIG. 7(k), the emitter electrode 29, the base electrode 28, and the collector electrode 27 are formed.

As described above, the fabricating process of the HBT includes three selective regrowths. If an impurity such as oxygen exists on the interface between the emitter layer 19 and the base layer 16 during regrowing of the emitter layer 19, this results in the increase of a leakage current, and proper functioning of the transistor cannot be obtained.

However, if the combined processes which include the low temperature HCl treatment described in the first embodiment are incorporated into the processes including the selective regrowth, the crystal growth of regrowth layer and the cleanliness of the regrowth interface can be maintained at the same degree of as in the case where the regrowth layer and interface would have been sucessively formed, thus excluding the possibility of a leakage current and assuring the production of a high performance HBT having desired characteristics.

[EMBODIMENT 4]

A method of fabrication a buried ridge type semiconductor laser utilizing a combined process including the low temperature HCl treatment discussed in the first and second embodiments will be described below as the fourth embodiment of this invention.

FIGS. 12(a)–12(d) are cross-sectional views showing the fabrication of the buried ridge type semiconductor laser of this embodiment where reference numeral 31 designates an n type GaAs layer, reference numeral 32 designates an n type AlGaAs layer, and reference numeral 33 designates an active layer forming the quantum well structure with multiple AlGaAs layers of different Al ratios. Reference numeral 34 designates a p type AlGaAs layer, reference numeral 35 designates a p type GaAs cap layer, reference numeral 36 designates an SiN film, reference numeral 37 designates an n type GaAs current blocking layer, reference numeral 38 designates a p type GaAs cap layer, and reference numeral 39 designates a p type GaAs contact layer.

Next, the fabrication method is described. First, as shown in FIG. 12(a), the n type AlGaAs layer 32, the active layer with a quantum well structure 33, the p type AlGaAs layer 34, and the p type GaAs cap layer 35 are successively grown on the n type GaAs substrate 31, after which the SiN film 36 is formed on the cap layer 35, and then this SiN film 36 is patterned into a stripe configuration.

Figure 12:
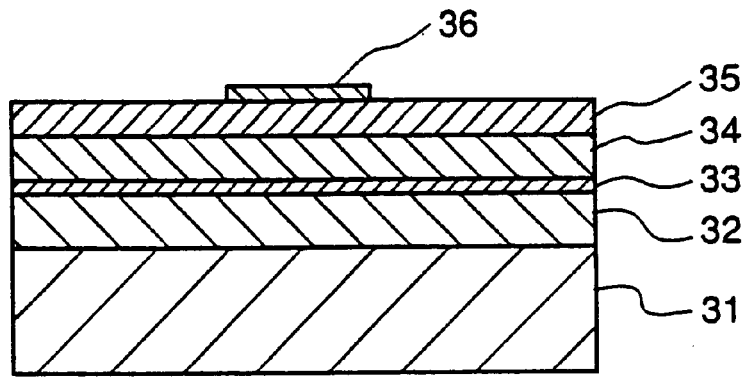
FIGS. 12(a)–12(d) are cross-sectional views showing a fabrication method of a buried ridge type semiconductor laser in accordance with a fourth embodiment of this invention.
Figure 12:
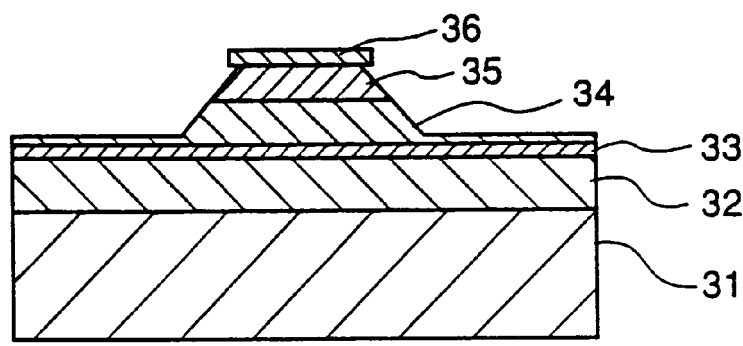
Figure 12:
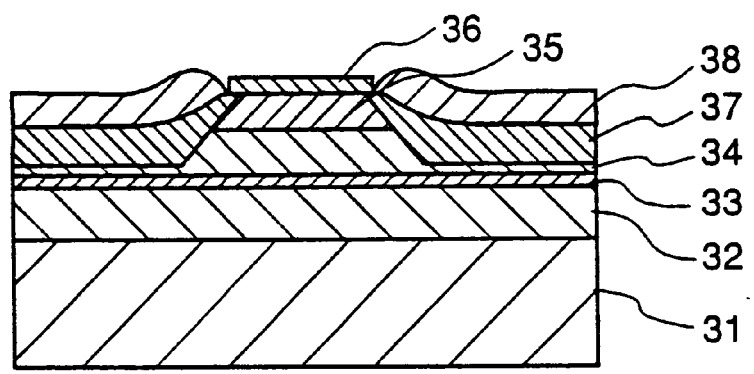
Figure 12:
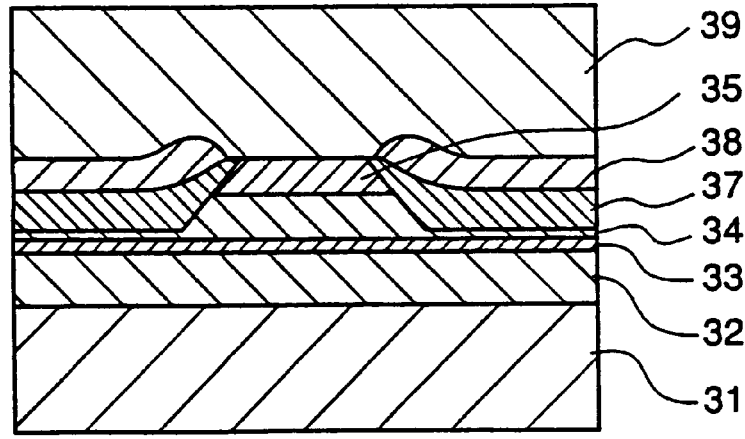

Next, as shown in FIG. 12(b), using the SiN film 36 as a mask, an oxide film which was naturally formed on the cap layer 35 is removed by, as discussed in the first embodiment, by supplying HCl gas, $AsH_3$, and hydrogen, with the temperature being maintained at 450° C. The sample is then treated with HCl, $AsH_3$, and hydrogen at a temperature of 750° C. in the same chamber as above so that it is dry-etched to form a ridge. Then, in the same chamber as above, the current blocking layer 37 and the p type GaAs cap layer 38 are grown using the MOCVD method, after which the SiN film 36 is removed and the contact layer 39 is formed.

The conventional buried ridge type laser was prepared by etching the cap layer 35 and the p type AlGaAs layer 34 to form the ridge at a temperature of 450° C. or above and selectively regrowing the current blocking layer 37 so as to surround the ridge. Therefore, it was likely that the regrowth interface of the current blocking layer 37 was contaminated with impurities or the crystal growth of the current blocking layer 37 was degraded such that leakage current occurred. According to the fabrication method of a semiconductor laser described in the fourth embodiment, however, it is possible both to maintain the regrowth interface of the current blocking layer 37 clean and to make the better crystal growth of the current blocking layer 37, so that a buried ridge type semiconductor laser with excellent characteristics is obtained.

[EMBODIMENT 5]

A method of fabricating a buried ridge type semiconductor laser utilizing a combined process which includes the low temperature HCl treatment described in the first and second embodiments will be described below as the fifth embodiment of this invention.

FIGS. 13(a)–13(d) are cross-sectional views showing the fabrication of the buried ridge type semiconductor laser according to the fifth embodiment, where reference numeral 40 designates a high resistance GaAs current blocking layer and the same reference numerals found in FIGS. 12(a)–12(d) designate like or corresponding elements.

Figure 13:
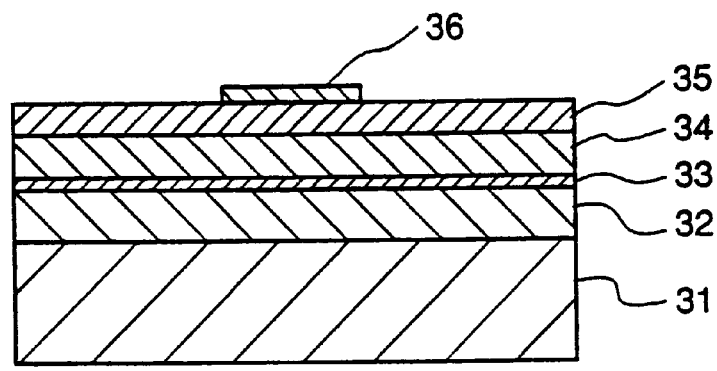
FIGS. 13(a)–13(d) are cross-sectional views showing a fabrication method of a buried ridge type semiconductor laser in accordance with a fifth embodiment of this invention.
Figure 13:
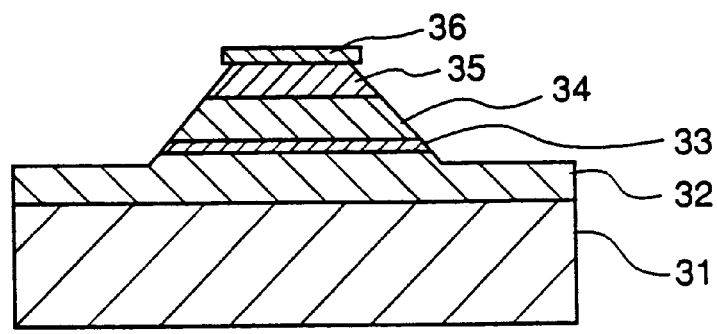
Figure 13:
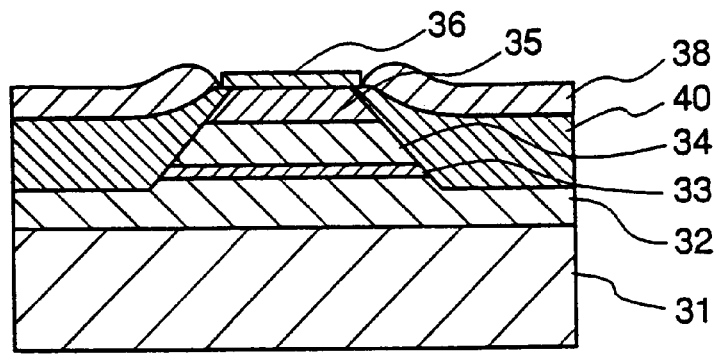
Figure 13:
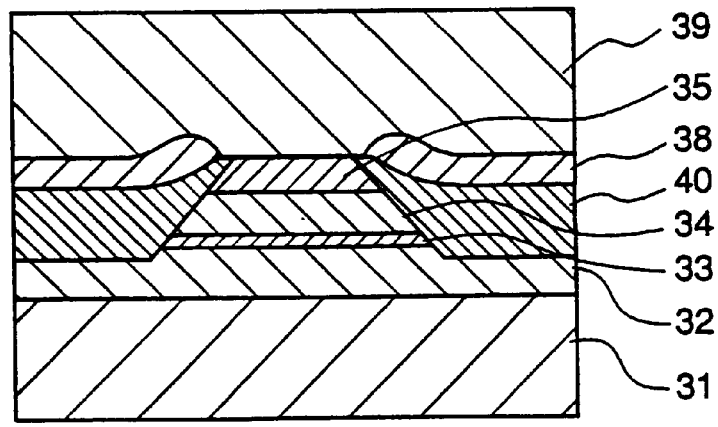

The fabrication method is described below. First, the n type AlGaAs layer 32, the active layer having a quantum well structure 33, the p type AlGaAs layer 34, and the p type GaAs cap layer 35 are successively grown on the n type GaAs substrate 31 as shown in FIG. 13(a). Later, the SiN film 36 is formed on the p type GaAs layer 34, which is patterned into stripe configuration.

Next, as shown in FIG. 13(b), with the SiN film 36 being a mask, the sample is subjected to a mixture of HCl, AsH$_3$, and hydrogen at a temperature of 450° C. or below inside the chamber to remove an oxide film which was naturally formed on the cap layer 35, after which the sample is further subjected to the mixture gas of HCl, AsH$_3$, and hydrogen at a temperature of 750° C. or above inside the same chamber in order to dry-etch the cap layer 35, the p type AlGaAs layer 34, the AlGaAs active layer of quantum well structure 33, and the n type AlGaAs layer 32 into a ridge. Then, the high resistance GaAs current blocking layer 40 and the p type GaAs cap layer 38 are formed on the exposed surface of the n type AlGaAs layer 32 after the above etching procedure, using the MOCVD method. Then, the SiN film 36 is removed and the contact layer 39 is formed.

In the above fifth embodiment of fabricating a buried ridge type semiconductor laser, the low temperature HCl treatment is applied to the surface of the cap layer 35 and then the cap layer 35 and the p type AlGaAs layer 34 are dry-etched. Then the AlGaAs active layer having a quantum well structure 33 and the upper portion of the n type AlGaAs layer 32 are etched further, and then the high resistance current blocking layer 40 is grown on the exposed surface after the etching procedure. Therefore, it is possible to etch the p type AlGaAs layer 34 and the AlGaAs active layer of quantum well structure 33 without allowing Al to form a solid oxide; hence, the regrowth interface of the high resistance current blocking layer 40 can be maintained clean and the crystal growth of the current blocking layer 40 can be improved, resulting in a buried ridge type laser of excellent characteristics.

The processes described in the first and second embodiments can be utilized in a method for fabricating a semiconductor device which requires a clean interface between a substrate and a recrystallized layer and is not limited to a certain type of semiconductor devices. In this regard, in the above third, fourth, and fifth embodiments, the combined processes described in the first and second embodiments are applied to the fabrication methods of the HBT and the buried ridge type semiconductor laser. However, this invention can also be extended to fabrication methods of other semiconductor devices, and semiconductor devices of higher performance than those fabricated in the conventional method can easily be obtained.

[EMBODIMENT 6]

Next, a sixth embodiment of this invention is described below. In the first embodiment, it was described that the low temperature HCl treatment was applied to the surface of the GaAs cap layer of the sample, and then the sample was dry-etched until it reached the AlGaAs layer, and then the crystal regrowth took place. In this sixth embodiment, it will be shown that the same procedure as the low temperature HCl treatment described above, that is, the sample is subjected to the gaseous environment including the halogen gas at a temperature of 450° C. or below so that the adsorption and desorption reaction between the halogen gas molecules and the oxide film which was naturally formed on the sample will remove the oxide film can separately be used to clean a crystal surface of a semiconductor. For example, a GaAs substrate is maintained at a temperature of 450° C. or below and subjected to a mixture including HCl, hydrogen, and AsH$_3$. The oxide film is then removed and a GaAs substrate which has a clean crystal surface is obtained.

According to the cleaning method for a semiconductor crystal surface described above, the oxide film on the semiconductor crystal surface is not heated beyond 450° C. which results in the transformation of the oxide film into the stiff compound, and the adsorption and desorption reaction between the gas molecules of the halogen gas and the oxide film removes the oxide film, resulting in a semiconductor which has a clean crystal surface.

[EMBODIMENT 7]

A seventh embodiment of this invention will be described as follows. In this embodiment, a selective regrowth is carried out by using the fabrication method of a semiconductor device discussed in the first embodiment, using an insulating film which is patterned.

FIGS. 14(a)–14(e) are cross-sectional views showing the fabrication method of a semiconductor device according to the seventh embodiment of this invention, where reference numeral 50 designates the insulating film and the same reference numerals found in FIGS. 2(a)–2(d) designate like or corresponding elements. The insulating film 50 is made of a material such as SiN, etc. which is usually used for masking for selective etching. Reference numeral 51 designates the opening in the insulating film 50. Those processes enclosed with a dashed line are performed successively within the MOCVD chamber.

Next, the fabrication method is described below. Using the MOCVD (metal organic chemical vapor deposition) method, the layer 2 of Al$_x$Ga$_{1-x}$As (x=0.48) of a thickness having 2 μm and the GaAs cap layer 3 having a thickness of 0.1 μm are formed on the GaAs substrate 1, and then, the SiN film 50 is formed on the GaAs cap layer (FIG. 14(a)). Next, the substrate 1 is taken out of the MOCVD chamber, and a photo-resist (not shown in the figure) is formed on the SiN film 50 and the photo-resist is subjected to light exposure for patterning. The patterned photo-resist is now used as a mask to make the opening 51 in the SiN film 50 and the photo-resist is subsequently removed. During this process, the oxide film 6 having a thickness of a few to 10 Å is formed on the GaAs cap layer 3 which has been exposed through the opening 51 due to the reaction with an atmospheric environment (FIG. 14(b)). Then, this substrate 1 is again set in the MOCVD chamber, where the substrate 1 is heated to 350° C. within a gaseous environment including hydrogen and AsH$_3$, and, maintaining the temperature of 350° C., the substrate is treated with a mixture of hydrogen, arsine (AsH$_3$), and HCl for 50 to 100 minutes to remove the oxide film 6 from the surface of the GaAs cap layer (FIG. 14(c)). This removal process of the oxide layer 6 from the surface of the cap layer is performed through the continual adsorption and desorption reaction between the halogen gas such as HCl and the oxide film. Using this low temperature HCl treatment, the oxide film on the surface of the GaAs cap layer is completely removed. This low temperature HCl treatment is performed with the following flow rates; hydrogen 2.5 slm(1/min), AsH$_3$ (20%) 10 sccm(cc/min), and HCl (10%) 40 sccm. After completely removing the oxide film 6 by this low temperature HCl treatment, the GaAs cap layer 3 is etched. For the duration of time assumed in this embodiment, about 100 Å are etched.

Figure 14:
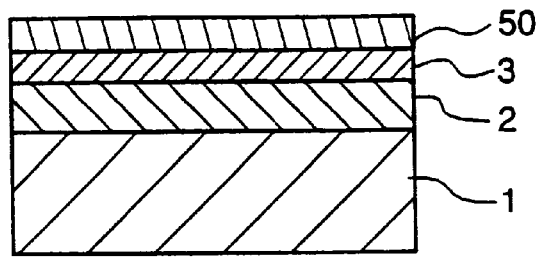
FIGS. 14(a)–14(e) are cross-sectional views showing a fabrication method of a semiconductor device in accordance with a seventh embodiment of this invention.
Figure 14:
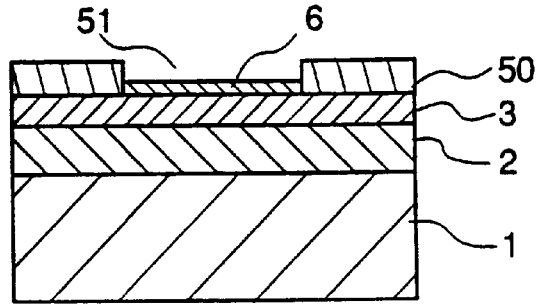
Figure 14:
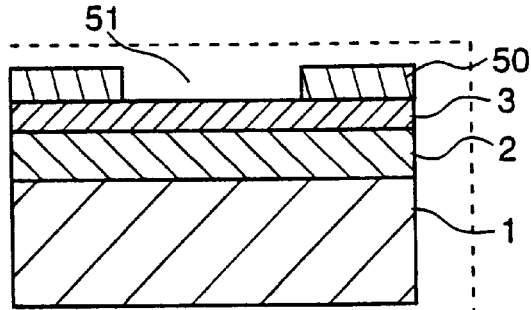
Figure 14:
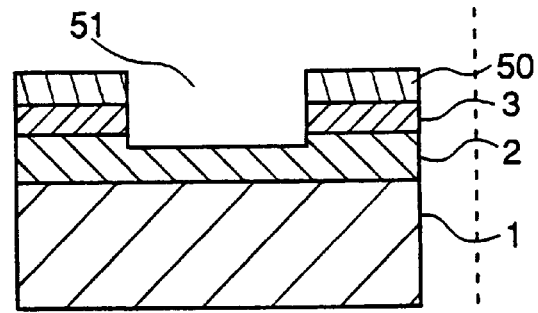
Figure 14:
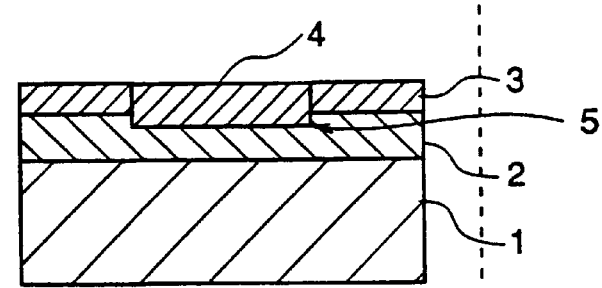

Next, using the usual method of HCl gas etching, the sample which was finished in the low temperature HCl treatment is etched on its GaAs cap layer 3 and AlGaAs layer 2, with the insulating film 50 being the mask, the temperature being maintained at 750° C., and the flow rates of hydrogen, AsH$_3$, and HCl being kept at the same values as for the low temperature HCl treatment (FIG. 14(d)). 0.8 μm is etched by this HCl gas etching, so that it reaches half way through the AlGaAs layer 2.

Then, using the MOCVD method, the GaAs layer 4 is selectively regrown on the portion of AlGaAs layer 2 which has been exposed after the etching, with the insulating film 50 being the mask. And then, the insulating film 50 is removed to produce the semiconductor device shown in FIG. 14(e).

In this embodiment, the insulating film 50 which is patterned to a desired configuration is formed on the surface of the GaAs cap layer 3 which is a protective layer formed on AlGaAs layer 2, and then, using this insulating film as a mask, the combined processes of the low temperature HCl treatment, dry-etching, and crystal regrowth, which have been described in the first embodiment, are applied. Therefore, it is possible to have the semiconductor layer 4 selectively regrown on the AlGaAs layer 2, to make the selectively regrown interface clean, and to improve the crystallization of the regrown semiconductor layer. This results in protection against the degradation of characteristics such as the occurrence of leakage current. This also improves both the electrical and optical characteristics of the regrown layer. Hence, applying these processes to the fabrication of semiconductor devices having a micro structure, a semiconductor device of superior characteristics is obtained. It is also possible to provide a semiconductor device which have a finer structure than a prior art.

Furthermore, in this embodiment, it is possible, as in the first embodiment, to use the layers consisting of the semiconductor materials such as Si, Ge, or III–V compounds instead of AlGaAs as the layer on which the crystal regrowth takes place, and to use the layers consisting of other semiconductor materials instead of GaAs layer as the regrown layer. The same result as obtained in the seventh embodiment can be obtained.

What is claimed is:

1. A method of fabricating a semiconductor device comprising:

forming successively by crystal growth a semiconductor layer comprising a compound semiconductor containing Al as a constituent and a cap layer comprising a compound semiconductor not containing Al as a constituent on a semiconductor substrate;

placing said cap layer and said semiconductor layer in a gaseous environment containing a halogen at a temperature not exceeding 450° C. so that an oxide film naturally formed on a surface of said cap layer is removed by reaction between said oxide film and the halogen;

replacing the gaseous environment, without exposing said cap layer to the atmosphere, with a gaseous environment for dry-etching said cap layer and said semiconductor layer and dry-etching at least said cap layer and said semiconductor layer perpendicular to the surface of said cap layer to reach one of said semiconductor layer and said semiconductor substrate; and replacing the gaseous environment for dry-etching, without exposing a crystalline surface exposed due to the dry-etching to the atmosphere, with a gaseous environment for crystal growth and growing another semiconductor layer on the crystalline surface exposed by dry-etching.

2. The fabrication method of claim 1 comprising:

forming a masking material on said cap layer after forming and before dry-etching said cap layer; and patterning said masking material into a desired configuration, wherein the removal of said oxide film, the dry-etching of said cap layer, and the growth of another semiconductor layer are selectively performed utilizing said masking material in the desired configuration as a mask.

3. The fabrication method of claim 1 wherein said semiconductor layer containing Al comprises AlGaAs, said cap layer comprises GaAs, and the gas containing a halogen is a mixture of HCl, hydrogen, and arsine (AsH$_3$).

4. The fabrication method of claim 1 wherein said cap layer comprises a III-V compound semiconductor and the gas containing a halogen contains as a constituent a Group V element that is a constituent of said cap layer.

5. The fabrication method of claim 1 wherein the gas containing a halogen is HCl.

6. The fabrication method of claim 1 wherein dry-etching of said cap layer is performed in a gas having the same composition as the gas containing a halogen.

7. The fabrication method of claim 1 wherein said semiconductor layer containing Al comprises a plurality of layers that include a layer containing Al.

8. A method of fabricating a semi conductor device comprising:

placing a first semiconductor layer in a gaseous environment containing a halogen at a temperature not exceeding 450° C. so that an oxide film naturally formed on a surface of said first semiconductor layer is removed by a reaction between said oxide film and the halogen; and replacing the gaseous environment, without exposing said first semiconductor layer to the atmosphere, with a gaseous environment for crystal growth and growing a second semiconductor layer on said first semiconductor layer from which said oxide film has been removed.

9. The fabrication method of claim 8 wherein said first semiconductor layer comprises a III–V compound semiconductor and the gas contains as a constituent a Group V element that is a constituent of said first semiconductor layer.

10. The fabrication method of claim 8 wherein the gas containing a halogen is HCl.

11. The fabrication method of claim 8 wherein said first semiconductor layer comprises a plurality of semiconductor layers.

12. A method of fabricating a semiconductor device comprising:

placing a first semiconductor layer in a gaseous environment containing a halogen at a temperature not exceeding 450° C. so that an oxide film naturally formed on a surface of said first semiconductor layer is removed by a reaction between said oxide film and the halogen;

replacing the gaseous environment, without exposing said first semiconductor layer to the atmosphere, with a gaseous environment for dry-etching said first semiconductor layer and dry-etching said first semiconductor layer perpendicular to the surface of said first semiconductor layer from which said oxide film has been removed; and replacing the gaseous environment, without exposing said first semiconductor layer to the atmosphere, with a gaseous environment for crystal growth and growing a second semiconductor layer on a surface of said first semiconductor layer that has been exposed by dry-etching.

13. The fabrication method of claim 12 wherein said first semiconductor layer comprises a III-V compound semiconductor and the gas containing a halogen contains as a constituent a gas containing a Group V element that is a constituent of said first semiconductor layer.

14. The fabrication method of claim 12 wherein the gas containing a halogen is HCl.

15. The fabrication method of claim 12 wherein dry-etching of said first semiconductor layer is performed in a gas having the same composition as the gas containing a halogen.

16. The fabrication method of claim 12 wherein said first semiconductor layer comprises a plurality of semiconductor layers.

17. A method of cleaning a surface of a semiconductor including placing a semiconductor in a gaseous environment containing a halogen at a temperature not exceeding 450° C. so that an oxide film naturally formed on a surface of said semiconductor is removed by a reaction between said oxide film and the halogen.

18. The cleaning method of claim 17 wherein said semiconductor comprises a III-V compound semiconductor and the gas containing a halogen contains as a constituent a Group V element that is a constituent of said semiconductor.

19. The cleaning method of claim 17 wherein the gas containing a halogen is HCl.

* * * * *